United States Patent
Marendic et al.

(10) Patent No.: US 11,719,736 B2
(45) Date of Patent: *Aug. 8, 2023

(54) METHOD FOR LOCATING AND ISOLATING A FAULT IN A POWER DISTRIBUTION NETWORK

(71) Applicant: S&C Electric Company, Chicago, IL (US)

(72) Inventors: Boris Marendic, Chicago, IL (US); Yoav Sharon, Evanston, IL (US)

(73) Assignee: S&C Electric Company, Chicago, IL (US)

(*) Notice: Subject to any disclaimer, the term of this patent is extended or adjusted under 35 U.S.C. 154(b) by 281 days.

This patent is subject to a terminal disclaimer.

(21) Appl. No.: 17/501,136

(22) Filed: Oct. 14, 2021

(65) Prior Publication Data

US 2022/0178985 A1      Jun. 9, 2022

Related U.S. Application Data

(60) Provisional application No. 63/122,150, filed on Dec. 7, 2020.

(51) Int. Cl.
  *G01R 31/08*  (2020.01)
  *H02H 3/06*   (2006.01)
  *H02H 7/26*   (2006.01)

(52) U.S. Cl.
  CPC ......... *G01R 31/086* (2013.01); *H02H 3/063* (2013.01); *H02H 7/261* (2013.01)

(58) Field of Classification Search
  CPC ....... G01R 31/086; H02H 3/063; H02H 7/261
  See application file for complete search history.

(56) References Cited

U.S. PATENT DOCUMENTS

| | | | |
|---|---|---|---|
| 6,694,271 B1 | 2/2004 | Hannon | |
| 10,269,509 B1 * | 4/2019 | Habib | H02J 3/32 |
| 11,128,127 B2 * | 9/2021 | Quinlan | G06Q 50/06 |
| 2013/0070378 A1 | 5/2013 | White | |
| 2014/0159740 A1 | 6/2014 | Schuster et al. | |

(Continued)

FOREIGN PATENT DOCUMENTS

EP      3605436 A1 *   2/2020   ........... G01R 31/086

OTHER PUBLICATIONS

U.K. Search Report for British Application No. GB2116414.0 dated Jul. 8, 2022. (1 page).

*Primary Examiner* — Sisay G Tiku

(57) ABSTRACT

A method for fault location and isolation in a power distribution network, where the network includes a plurality of switching devices provided along a feeder, and at least one of the switching devices does not have voltage sensing capabilities. The method includes detecting an overcurrent event in the network from the fault and interrupting the overcurrent event by opening and then immediately locking out or subsequently reclosing and testing the fault. A count value is increased in each switching device that detected the overcurrent event. A message is sent from each of the switching devices that detected the overcurrent event and then detected the loss of voltage upstream to an upstream neighbor switching device. Current measurements in the messages, measured current by the devices and the counts values in the devices determine what devices are opened to isolate the fault.

23 Claims, 6 Drawing Sheets

(56) References Cited

U.S. PATENT DOCUMENTS

| | | | |
|---|---|---|---|
| 2020/0259320 A1* | 8/2020 | Guo | H02H 3/042 |
| 2020/0309841 A1* | 10/2020 | Sharon | H02H 7/261 |
| 2020/0350761 A1 | 11/2020 | Wang et al. | |
| 2021/0036508 A1* | 2/2021 | Quinlan | G05B 19/042 |
| 2022/0109295 A1* | 4/2022 | Quinlan | H02J 3/0012 |
| 2022/0109301 A1* | 4/2022 | Quinlan | H02J 3/388 |
| 2022/0109302 A1* | 4/2022 | Quinlan | H02J 13/00017 |
| 2022/0181871 A1* | 6/2022 | Marendic | G01R 19/10 |
| 2022/0268826 A1* | 8/2022 | Guo | H04L 43/028 |
| 2022/0269234 A1* | 8/2022 | Sharon | H04L 43/028 |
| 2022/0271534 A1* | 8/2022 | Guo | H04L 43/028 |

* cited by examiner

METHOD FOR LOCATING AND ISOLATING A FAULT IN A POWER DISTRIBUTION NETWORK

CROSS-REFERENCE TO RELATED APPLICATION

This application claims the benefit of priority from the U.S. Provisional Application No. 63/122,150, filed on Dec. 7, 2020, the disclosure of which is hereby expressly incorporated herein by reference for all purposes.

BACKGROUND

Field

The present disclosure relates generally to systems and methods for fault location and isolation in an electrical power distribution network and, more particularly, to systems and methods for fault location and isolation in an electrical power distribution network, where the method employs communications between switching devices that allows for isolation of the fault prior to completion of a reclosing operation, and where at least one of the switching devices does not have voltage sensing capabilities.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single-phase lateral lines are tapped off of the feeder that provide the medium voltage to various distribution transformers, where the voltage is stepped down to a low voltage and is provided to a number of loads, such as homes, businesses, etc.

Periodically, faults occur in the distribution network as a result of various events, such as animals touching the lines, lightning strikes, tree branches falling on the lines, vehicle collisions with utility poles, etc. Faults may create a short-circuit that increases the load on the network, which may cause the current flow from the substation to significantly increase, for example, many times above the normal current, along the fault path. This amount of current causes the electrical lines to significantly heat up and possibly melt, and also could cause mechanical damage to various components in the substation and in the network. Many times the fault is a temporary or intermittent fault as opposed to a permanent or bolted fault, where the cause of the fault is removed a short time after the fault occurs, for example, a lightning strike, and where the distribution network almost immediately resumes operating normally.

Fault interrupters, for example, reclosers that employ vacuum interrupters, are provided on utility poles and in underground circuits along a power line and have a switch to allow or prevent power flow downstream of the recloser. These reclosers detect the current and voltage on the line to monitor current flow and look for problems with the network circuit, such as detecting a fault. If fault current is detected the recloser is opened in response thereto, and then after a short delay closed to determine whether the fault is a temporary fault. If fault current flows when the recloser is closed, it is immediately opened. If the fault current is detected again during subsequent opening and closing operations, sometimes referred to herein as a shot, indicating a permanent fault, then the recloser remains open, referred to herein as a lockout, where the time between detection tests may increase after each test. For a typical reclosing operation for fault detection tests, about 3-6 cycles of fault current pass through the recloser before it is opened.

When a fault is detected, it is desirable that the first fault interrupter upstream from the fault be opened as soon as possible so that the fault is quickly removed from the network so that the loads upstream of that fault interrupter are not disconnected from the power source and service is not interrupted to them. It is further desirable that if the first fault interrupter upstream from the fault does not open for whatever reason, then the next fault interrupter upstream from the fault is opened, and so on. In order to accomplish this, it is necessary that some type of communications or coordination protection scheme be employed in the network so that the desired fault interrupter is opened in response to the fault.

A sectionalizer is a self-contained, circuit-opening device used in combination with source-side protective devices, such as reclosers or circuit breakers, to automatically isolate faulted sections of an electrical distribution network. A faulted circuit indicator is a device that automatically detects and identifies faults in an electrical distribution network, but does not have switching capabilities to open a power line. The devices are typically distributed between and among the reclosers to provide a system for isolating smaller sections of the network in response to a fault. Faulted circuit indicators and sectionalizers rely on observing a sequence of fault currents and the presence and absence of healthy voltage either to indicate the presence of a fault or count the number of reclosing attempts, and then perform circuit isolation sectionalizing when the maximum number of reclosing attempts has been reached. Existing power distribution circuit sectionalizers detect the passage of fault currents, including both the initial fault event and subsequent recloser-initiated events, as part of more elaborate fault isolation and restoration processes. These processes may include counting discrete intervals of fault current passage, or counting discrete intervals of voltage presence and absence.

Modern power distribution networks of the type being discussed herein usually operate as intelligent distribution automation systems, i.e., provide intelligent control over electrical power grid functions to the distribution level and beyond, where many of the devices talk to each other and perform functions based on received information. These systems require device control that needs to have the knowledge of the system topology, i.e., the architecture or data structure, for automation tasks, where the main purpose of the knowledge dissemination is to enable automatic restoration from faults. For example, to decide what network sections alternative power sources can provide power to, the automatic restoration will need the relevant network information, such as power being consumed in each section.

In known automatic restoration schemes, opening the switching devices for isolating faults in a certain section is performed after the reclosing device is locked out, which could be up to four reclosing operations, where each subsequent closing operation of the device is typically of a longer duration. Thus, it would be beneficial if those fault-isolation switching devices could be opened quicker. Further, there could be mis-coordination between switching devices as a result of an inadequate protection scheme, which results in an unfaulted section left without power unnecessarily. Also, the number of sectionalizers provided between reclosers is limited to the number of reclosing operations that are performed when a fault is detected because those devices have limited logic and count the number of times they detect fault current followed by loss of voltage (LoV) before they open to isolate a fault.

SUMMARY

The following discussion discloses and describes a system and method for fault location and isolation in an electrical power distribution network, where the network includes at least one power source, at least one feeder and a plurality of switching devices positioned along the at least one feeder and being in communications with each other, and where network sections are defined between adjacent switching devices and at least one of the switching devices does not have a voltage sensing capability. The method includes detecting an overcurrent event (OC) in the network from the fault by at least some of the switching devices and interrupting the overcurrent event by opening and then subsequently closing at least one of the switching devices that detected the overcurrent event. A count value is increased in the switching device that interrupted the overcurrent event and in each of the switching devices that detected the overcurrent event and then detected loss of voltage upstream, in each of the switching devices that detected the overcurrent event and does not have a voltage sensing capability and in each of the switching devices that detected the overcurrent event, does not have a voltage sensing capability and inferred the loss of voltage upstream by measured current. A count and current (C&I) message is sent from each of the switching devices that detected the overcurrent event and then measured the loss of voltage upstream, from each of the switching devices that detected the overcurrent event and has an upstream neighbor switching device that does not have a voltage sensing capability, from each of the switching devices that detected the overcurrent event and does not have a voltage detecting capability, and from each of the switching devices that detected the overcurrent event, does not have a voltage detecting capability and inferred loss of voltage upstream by measured current, the C&I message including a measured current by the sending switching device and the count value of the sending switching device. A C&I timer is started in each switching device that sends a C&I message as described above. A current matching test is performed in each switching device that started the C&I timer, when the C&I timer expires, and is performed between the current measured locally by that switching device, and current received in the C&I message. A fault isolation table is populated in each switching device that starts its C&I timer, which includes its measured current and accumulated current from a received C&I message. The process of interrupting the overcurrent event, increasing the count value, sending the C&I messages, starting the C&I timer, performing the current matching test and populating the fault isolation table is repeated. When it is determined that the fault is in an immediate downstream section of a switching device based on the count value in that device matching a predetermined first count value and a current matching test failure, a downstream switch open message is sent to the immediate downstream switching devices (could be more than one) from the switching device that determined that the fault is in its immediate downstream section to isolate the downstream end of the faulted section. An upstream switch open message is sent to a downstream switching device to open the switching device from a sending switching device that has a count value matching a predetermined second count value if the sending switching device has a voltage sensing capability and detects an upstream loss of voltage, the sending switching device does not have a voltage sensing capability and did not open to interrupt the overcurrent event, the switching device is a sectionalizer and does not have a voltage sensing capability and the sending switching device is capable of interrupting the overcurrent event, does not have a voltage sensing capability and inferred the loss of voltage from measured current, where the first count value is less than the second count value. The interrupting device is locked open when its count value matches a predetermined third count value, where the third count value is greater than the second count value, and where the interrupting device ignores the upstream switch open message if it receives the message. An information message is sent containing fault location information from the device that determined that the fault is in its immediate downstream section. Power restoration processes can be initiated once the faulted section is isolated, using the information from the information message. Inferring the loss of voltage by the switching devices that do not have a voltage sensing capability includes determining that the measured current before the overcurrent event was above a current threshold, then determining that the measured current dropped below the current threshold after the overcurrent event.

Additional features of the present disclosure will become apparent from the following description and appended claims, taken in conjunction with the accompanying drawings.

DETAILED DESCRIPTION OF THE EMBODIMENTS

Figure 1:
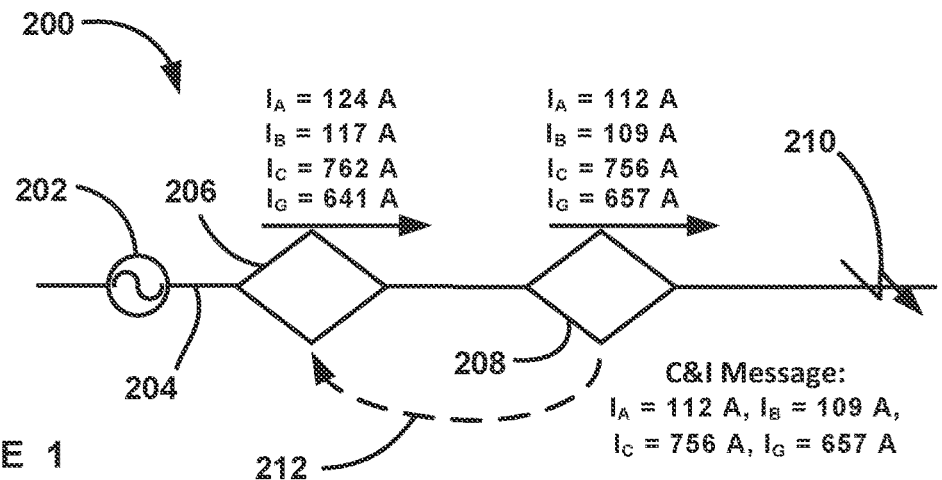
FIG. 1 is a simplified schematic type diagram of an electrical power distribution network.

The following discussion of the embodiments of the disclosure directed to systems and methods for fault location and isolation in an electrical power distribution network is merely exemplary in nature, and is in no way intended to limit the disclosure or its applications or uses.

This disclosure proposes a fault location and isolation scheme that identifies faulted sections of a network using both local measurements and message exchanges without relying on coordination between switching devices, and commands the surrounding switching devices to open possibly before the fault is fully interrupted, i.e., locked out, where the switching devices can be any suitable switching device for the purposes discussed herein, such as fault interrupting devices, reclosers, sectionalizers, etc. Traditional fault isolation and reclosing schemes may take up to four reclose test periods to occur, sometimes referred to herein as shots. The proposed fault location and isolation scheme allows for unlimited segmentation of the feeder, even where traditional coordination does not function, to minimize the area of the faulted section that is left without power.

In addition to the capability of the fault location and isolation scheme for fast isolation before device lockout, the isolation scheme is also designed to support unlimited segmentation with sectionalizers or reclosers, work with closed-loop configurations, work with communications interruptions, work with mis-coordinated configurations, i.e., where the reclosers are not properly coordinated where an upstream recloser would act to clear a fault before a downstream recloser, and prevent the wrong switching device from locking out, initiate transfer while within short reclosing, reduce network traffic, and work with multiple faults, both synchronous and sequential.

Certain scenarios that combine two or more of the above-described contingencies may result in a less-than-optimal outcome as some un-faulted sections of the network might not be restored. However, under no scenario would a faulted section be tested more than the allowed shots-to-lockout of any device, nor would there be an attempt to connect a faulted section to an alternate source.

The fault location and isolation scheme described herein is a distributed mechanism because it runs simultaneously on each participating switching device in the network. The scheme does not alter or hinder the protection configuration in any device and serves as an additional logical entity along with the protection. The fault location and isolation scheme itself is designed as a set of two smaller logic entities, where one entity performs fault location and the other entity performs fault isolation.

The purpose of the fault location logic running on a device is to establish whether the fault current is associated with a fault in the section immediately downstream of that device. During fault location, all occurrences of fault current or overcurrent are treated as separate fault events, even though each occurrence may result from the same total fault event, but during a different reclosing shot.

For the discussion of the fault location and isolation scheme, the following definitions are used going forward. A downstream section is defined as the section immediately adjacent to a certain switching device and in the direction of the fault. In this way the term downstream section has the same meaning in both radial networks and closed-loop networks. An overcurrent or fault current event is defined as a single event when the current level exceeds a predefined pickup value until the current goes below the value. A total fault event is defined as the over-arching set of over-current events spanning all of the allowed reclosing periods.

In order to implement the fault location and isolation scheme described herein, each device needs to be able to measure current and voltage. All of the switching devices that detect overcurrent provide measurements of fault current independently and first make a determination of whether the observed fault current is potentially associated with a fault in their downstream section. The fault is clearly outside of the downstream section if it is interrupted by a device downstream of the measuring device. That is indicated by a return of a healthy voltage at the measuring device without the device itself opening.

A fault isolation table is shown in Table 1 below, and maybe populated depending on actual events. Upon observing fault current, a switching device waits until the fault current is interrupted. At that point, if the device itself opened to interrupt the fault current, or there is loss of voltage upstream where another device upstream of the device interrupted the fault current, it determines that the fault is potentially within its downstream section. However, a fault that is potentially in the downstream section may still be further downstream because of mis-coordination or because the devices downstream cannot interrupt the fault current. In order to conclusively determine the location of the fault, a local count value is maintained in each device and is used in conjunction with the fault isolation table. The device increases its local count by 1 whenever it detects fault current, and stores it separately from the table. If the device is opened to interrupt fault current or healthy voltage returns when the fault current is interrupted, the device stores overcurrent information as a table entry in the fault isolation table in the row corresponding to its local count value, and fills the first three columns of the table based on its local voltage and current measurements. Fault direction can be determined by a directional element or, if one does not exist, from network topology as the direction opposite that of the source. The fourth column in the table is initialized to 0, and the last column in the table is initialized to false.

TABLE 1

| Time Stamp | Fault Direction | Measured Phase and Ground Currents (Own) | Accumulated Phase and Ground Currents (Downstream) | Timed Out Flag |
| --- | --- | --- | --- | --- |

In response to detecting fault current, each switching device also sends out a count-and-current (C&I) message to its upstream neighbor device only if there was an upstream loss of voltage (LoV), where the C&I messages contain local phase and ground fault current measurements and the local count value of the sending device. This means that the device that opened to interrupt the fault current does not send C&I messages unless it also detects LoV upstream, for example, there is a mis-coordination. The device also starts a C&I timer when it detects fault current to provide time for a C&I message to arrive from its downstream neighbor devices, where the C&I timer accommodates latencies in the communications. During steady state operation, when a switching device is not in an active total fault event, the table entries are erased, and the table is considered empty.

FIG. 1 is a simplified schematic type diagram of an electrical power distribution network 200 including a power source 202 feeding a feeder 204 having an upstream switching device 206 and a downstream switching device 208, where a fault 210 is occurring downstream of the downstream switching device 208 on the feeder 204. The measured current for phases A, B and C and the ground current G are shown.

Consider that the downstream device 208 is sending a C&I message 212 to the upstream device 206, where it is assumed that the C&I message 212 is the first message that the upstream device 206 receives since the onset of the fault 210, and thus its phase and ground accumulators are all equal to 0. The message 212 includes a phase A current of 112 A, a phase B current of 109 A, a phase C fault current of 756 A and a ground current of 657 A. Assuming that the local count value of the upstream device 206 is 1, which is the same as the count value in the downstream device 208, the received current values in the message 212 are processed as follows by the upstream device 206. The phase A current in column 4 in the table entry (see Table 1) is updated as $I_A = I_A + 112$, the phase B current in column 4 in the table entry is updated as $I_B = I_B + 109$, the phase C current in column 4 in the table entry is updated as $I_C = I_C + 756$, and the ground current in column 4 in the table entry is updated as $I_G = I_G + 657$.

The location of the faulted section in the network is determined when the C&I timer expires in a device by performing a current matching test as described below. Each table row entry has its own C&I timer, and the decision of the fault location is made for each table entry independently, regardless of whether a C&I message for that entry arrives or not. In the cases when the communications channels are unreliable and the C&I messages do not arrive within the C&I timeout, an unfaulted section may be left unpowered, depending on the type of a fault.

The current matching test is performed in the following manner. The net phase current into the downstream section is computed as the difference between the locally measured phase current and the accumulated phase current, which are found in the fault isolation table. The result is stored as a vector, holding the value for each phase. Similarly, the net ground current into the downstream section is computed as the difference between the locally measured ground current and the accumulated ground current, which are also found in the fault isolation table, where the result is stored as a scalar. If none of the components of the net phase current exceed the predefined protection pickup settings, and the value of the net ground current is also below its predefined protection pickup setting for ground current, the current matching test is designated as a PASS, otherwise it is designated as NOT-PASS. The designation of a PASS label implies the fault is not in the downstream section of the device. Each device has a LoV Boolean indicator, which is stored separately from the fault isolation table, which holds the state of whether the device detected upstream LoV during the total fault event. The LoV indicator is initialized to false and it resets to false whenever the reclosing sequence reset timer expires, and is set to true whenever the device detects an upstream LoV and there is at least one fault entry in its fault isolation table.

For the following discussion, an INFO message is an informational message sent from a switching device designating the location of the faulted section as immediately downstream of the device that sent the message; an ISO-OPEN message is a message sent from a switching device downstream to instruct downstream neighbor devices to open and isolate the faulted section on the downstream side of the fault; an ISO-FULL message is a message sent from a switching device downstream to instruct the downstream devices to open and isolate the faulted section on the upstream side of the fault; an ISO-DN count value is a count on which a device starts isolating downstream of the fault; an ISO-FULL count value is a count on which a device starts isolating upstream of the fault that is applicable to sectionalizers, i.e., non-fault interrupting devices, and to mis-coordinated reclosers; and a lockout count value is a count that causes a fault interrupting device to lock open. The ISO-FULL count value must be smaller than the lockout count value of the upstream device in order to handle mis-coordination or if the device is not a fault-interrupting device. The maximum value that meets this constraint should be used to allow testing of the fault as many times as possible. A lower ISO-DN value results in faster service restoration for customers downstream of the fault. However, a lower ISO-DN value may also result in additional switching operations if the fault is temporary and is cleared before lock-out.

Similarly, if the local count value of the device reaches the ISO-FULL count value, and the device is sensing, through the LoV indicator, that another device upstream is operating, then the device itself opens, and sends out ISO-FULL messages to downstream neighboring devices. By setting the ISO-FULL count value to be lower than the lockout shot, this guarantees the fault is isolated before a further upstream device locks out. Note that if only one interrupting device is operating to test the fault, as determined by the presence of a healthy upstream voltage, that device ignores the ISO-FULL count value and continues to test for the fault to lockout according to its protection settings. When receiving an ISO-FULL message the receiving device opens if not open already. Once the device opens, it forwards the ISO-FULL message to the downstream devices if the local count value of the device is not equal to 0. If the local count value is equal to 0, restoration efforts may be started.

Thus, the isolation part of the mechanism speeds up the isolation by sending specialized messages to other devices to open once the faulted sections are identified. With multiple faults there could be multiple faulted sections, and multiple messages may need to be sent. Since the proposed isolation scheme does not interfere with protection configuration in any manner, unreliable communications and undelivered ISO and INFO messages mentioned above simply result in loss of enhanced functionality. In this case the traditional approaches take over, and isolation occurs at lockout.

Figure 2:
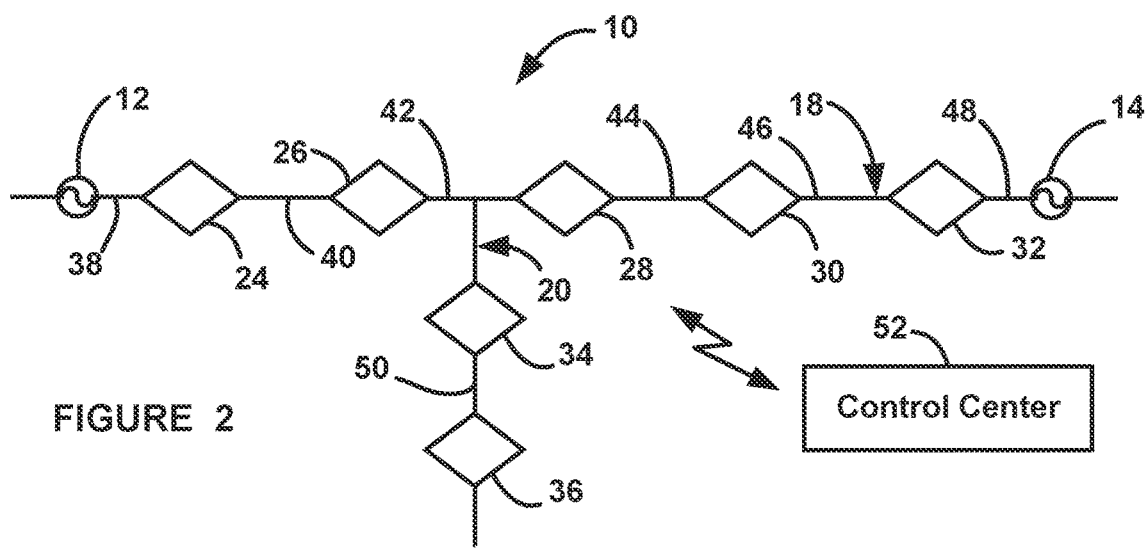
FIG. 2 is a simplified schematic type diagram of an electrical power distribution network for illustrating a fault location and isolation scheme.

FIG. 2 is a simplified schematic type diagram of an electrical power distribution network 10 that employs distributed control. The network 10 includes AC sources 12 and 14, such as electrical substations that step-down high voltage power from a high voltage power line (not shown) to medium voltage power. A primary feeder 18 is provided between the sources 12 and 14, and a secondary feeder 20 is coupled to the primary feeder 18. The network 10 also includes switching devices 24, 26, 28, 30 and 32 positioned along the feeder 18 and switching devices 34 and 36 positioned along the feeder 20, where the switching devices 24-34 can be any suitable device for the purposes discussed herein, such as reclosers, breakers, sectionalizers, etc. A line section 38 of the feeder 18 is provided between the source 12 and the device 28, a line section 40 of the feeder 18 is provided between the devices 24 and 26, a line section 42 of the feeders 18 and 20 is provided between the devices 26, 28 and 34, a line section 44 of the feeder 18 is provided between the devices 28 and 30, a line section 46 of the feeder 18 is provided between the devices 30 and 32, a line section 48 of the feeder 18 is provided between the source 14 and the device 32 and a line section 50 of the feeder 20 between the devices 34 and 36. The devices 24 and 36 are normally open devices and the devices 26-34 are normally closed devices so that the source 14 provides power to the sections 40-50. A control center 52 may be in, for example, radio communication with the switching devices 24-36 that may provide switching control consistent with the discussion herein.

The topology, i.e., device configuration, of the network 10 will be known by all of the devices 24-36 by communications therebetween, where the topology of the network 10 will be automatically revised and updated as devices are removed and added to the network 10. A power restoration algorithm may be performed in one of the switching devices 24-36, or the control center 52, that has been designated the leader device, where the leader device is in communication with all of the other devices 24-36 through any suitable communications protocol, such as radio transmissions, fiber optics, etc., to ensure the coordination of the restoration efforts and processes.

Figure 3:
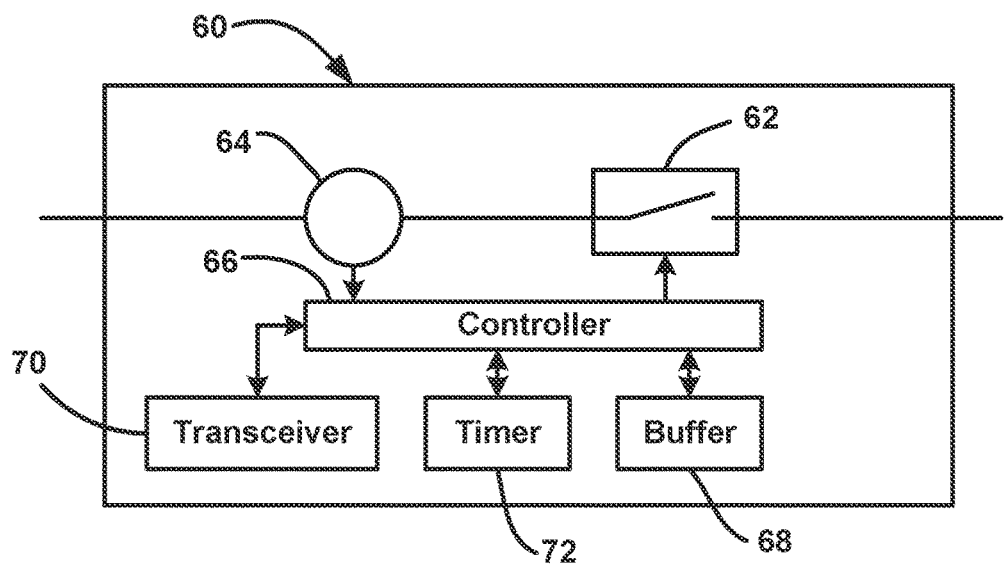
FIG. 3 is a simplified schematic block diagram of a switching device that can be employed in the network shown in FIG. 2.

FIG. 3 is a simplified schematic block diagram of a switching device 60 intended to be a non-limiting representation of any one of the switching devices 24-36 in the network 10, where the device 60 may include a switch 62, voltage/current sensors 64, a controller 66, a memory/buffer 68, where the fault isolation table and the LoV indicator may be stored in the memory 68, a transceiver 70 for transmitting and receiving C&I messages, and a C&I timer 72.

Figure 4:
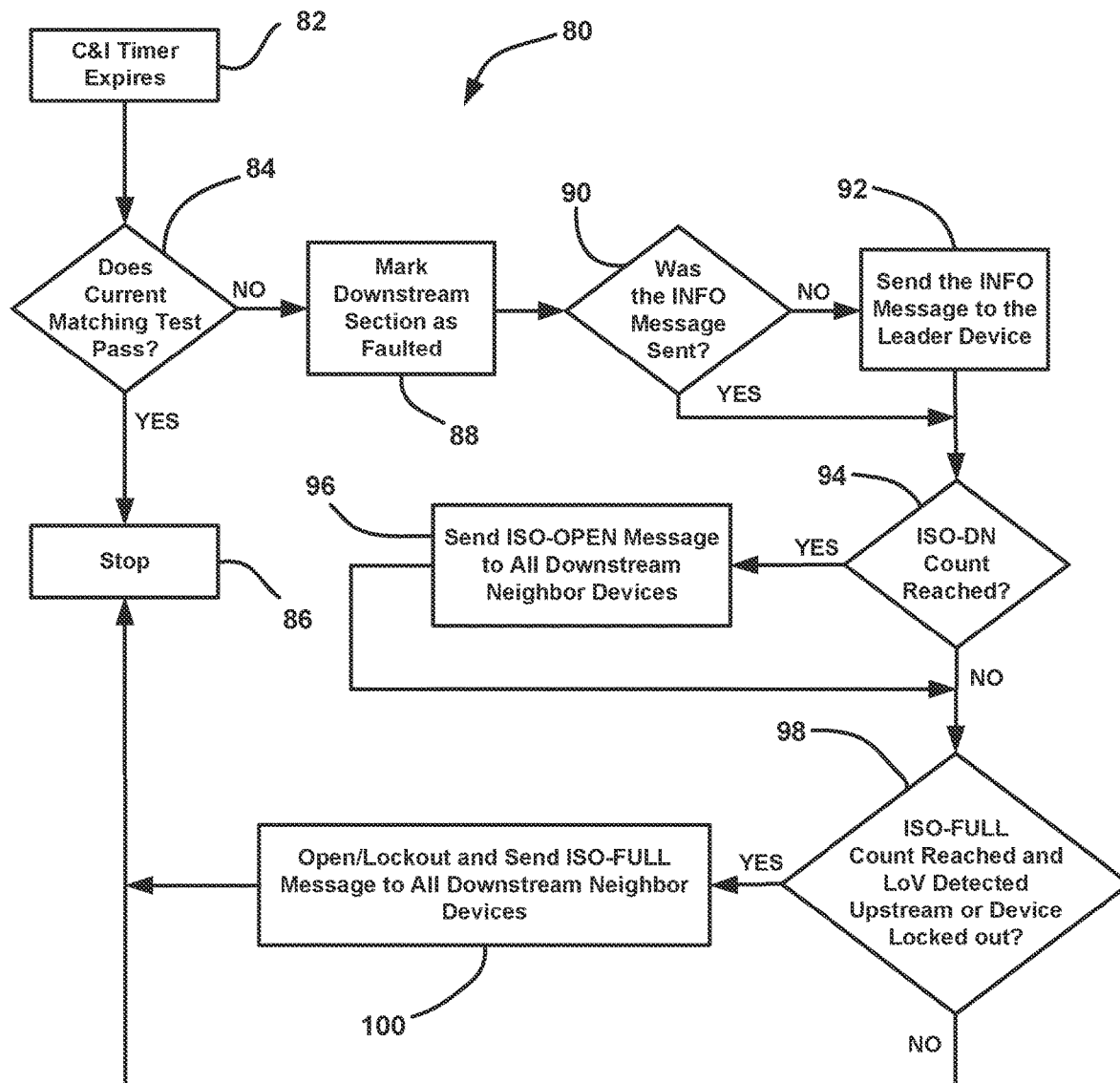
FIG. 4 is a flow chart diagram illustrating a process for the fault location and isolation scheme when a count and current (C&I) timer expires.

FIG. 4 is a flow chart diagram 80 illustrating the fault location and isolation process as described above in relation to the network 10 when the C&I timer expires at box 82 in, for example, the device 28. Decision diamond 84 determines whether the current matching test passes, and if so, the algorithm stops at box 86. If the current matching test does not pass at the decision diamond 84, then the downstream section 42 is faulted at box 88, and the algorithm determines if the device 28 sent the INFO message at decision diamond 90, and if not, the INFO message is sent at box 92. If the INFO message has been sent, then the algorithm determines if the ISO-DN count value has been reached at decision diamond 94, and if so, sends the ISO-OPEN message to the downstream neighbor devices 26 and 34 at box 96. If the ISO-DN count value has not been reached at the decision diamond 94 or the ISO-OPEN message has been sent at the box 96, then the algorithm determines if the ISO-FULL count value has been reached and LoV has been detected or the device 28 has locked out at decision diamond 98. If these events do not occur, the algorithm stops at the box 86. If the ISO-FULL count value in the device 28 has been reached and upstream LoV has been detected at decision diamond 98, then the algorithm opens the device 28, locks out, and sends the ISO-FULL message to the downstream devices 26 and 34 at box 100, and the algorithm stops at the box 86. If the device 28 locks out on its own due to protection configuration at the decision diamond 98, it sends the ISO-FULL message to the downstream neighbor devices 26 and 34 at the box 100, and the algorithm stopes at the box 86.

Figure 5:
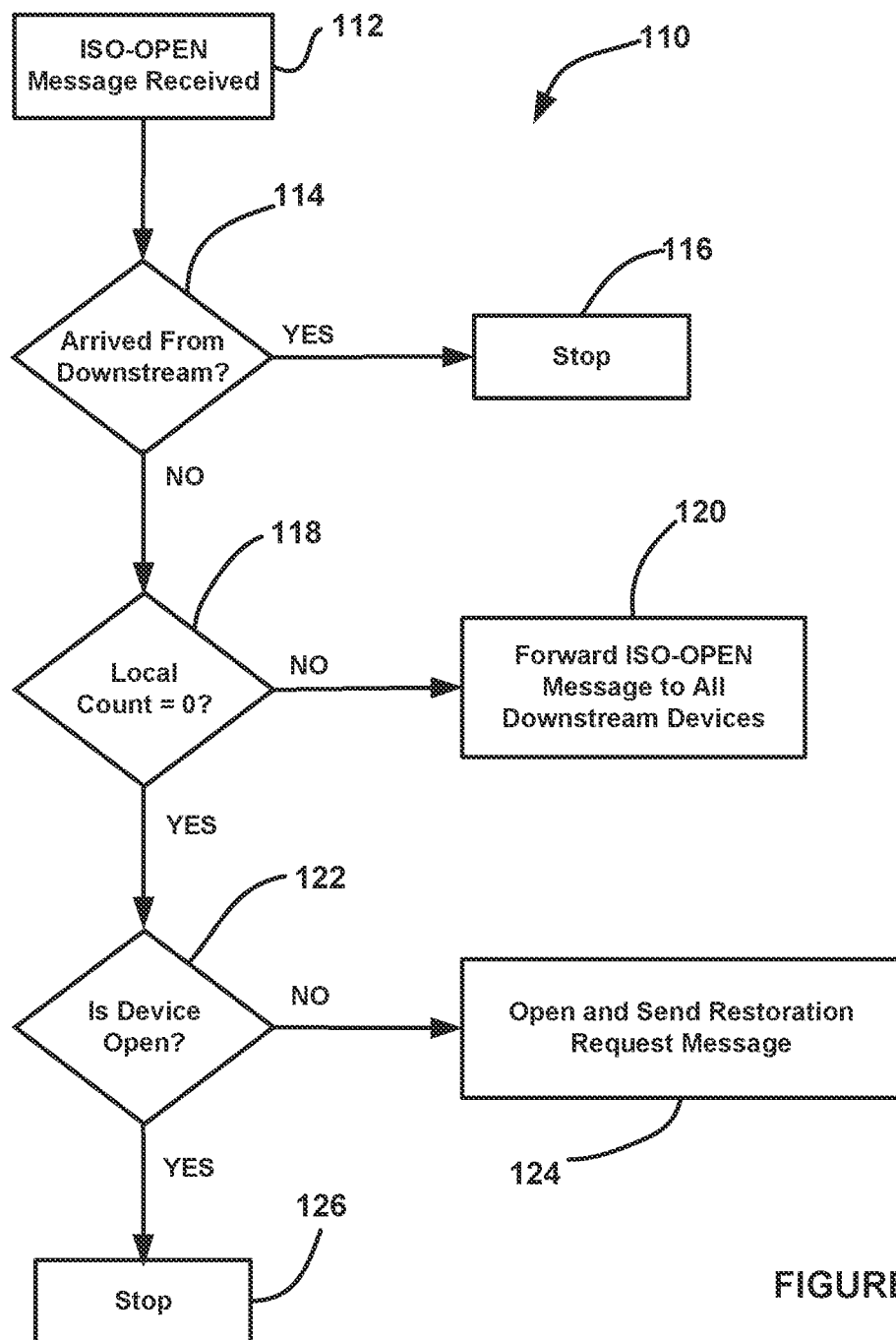
FIG. 5 is a flow chart diagram illustrating a process in the fault location and isolation scheme when a switching device receives a downstream open message.

FIG. 5 is a flow chart diagram 110 illustrating the process for when the devices 26 and 34 receive the ISO-OPEN message at box 112 from, for example, the device 28 that was sent at the box 96. The downstream devices 26 and 34 open if their local count value is 0, otherwise the ISO-OPEN messages are forwarded further downstream. Once the devices 26 and 34 opened, restoration efforts for the sections downstream of the fault can be started. The algorithm running in the devices 26 and 34 determines if the ISO-OPEN message is received from a downstream device at decision diamond 114, and if so, the algorithm stops at box 116. If the ISO-OPEN message is not received from a downstream device at the decision diamond 114, then the algorithm determines if the local count value in the devices 26 and 34 is 0 at decision diamond 118 meaning the device did not detect over-current followed by LoV before. If the local count is 1 or larger, the algorithm forwards the ISO-OPEN message to all of the downstream devices at box 120. If the local count value is 0 at the decision diamond 118, then the algorithm determines if the devices 26 and 34 are open at decision diamond 122, and if not, the algorithm opens the devices 26 and 34 and sends restoration request messages to the leader device at box 124. If the devices 26 and 34 are open at the decision diamond 122, then the algorithm stops at box 126.

Figure 6:
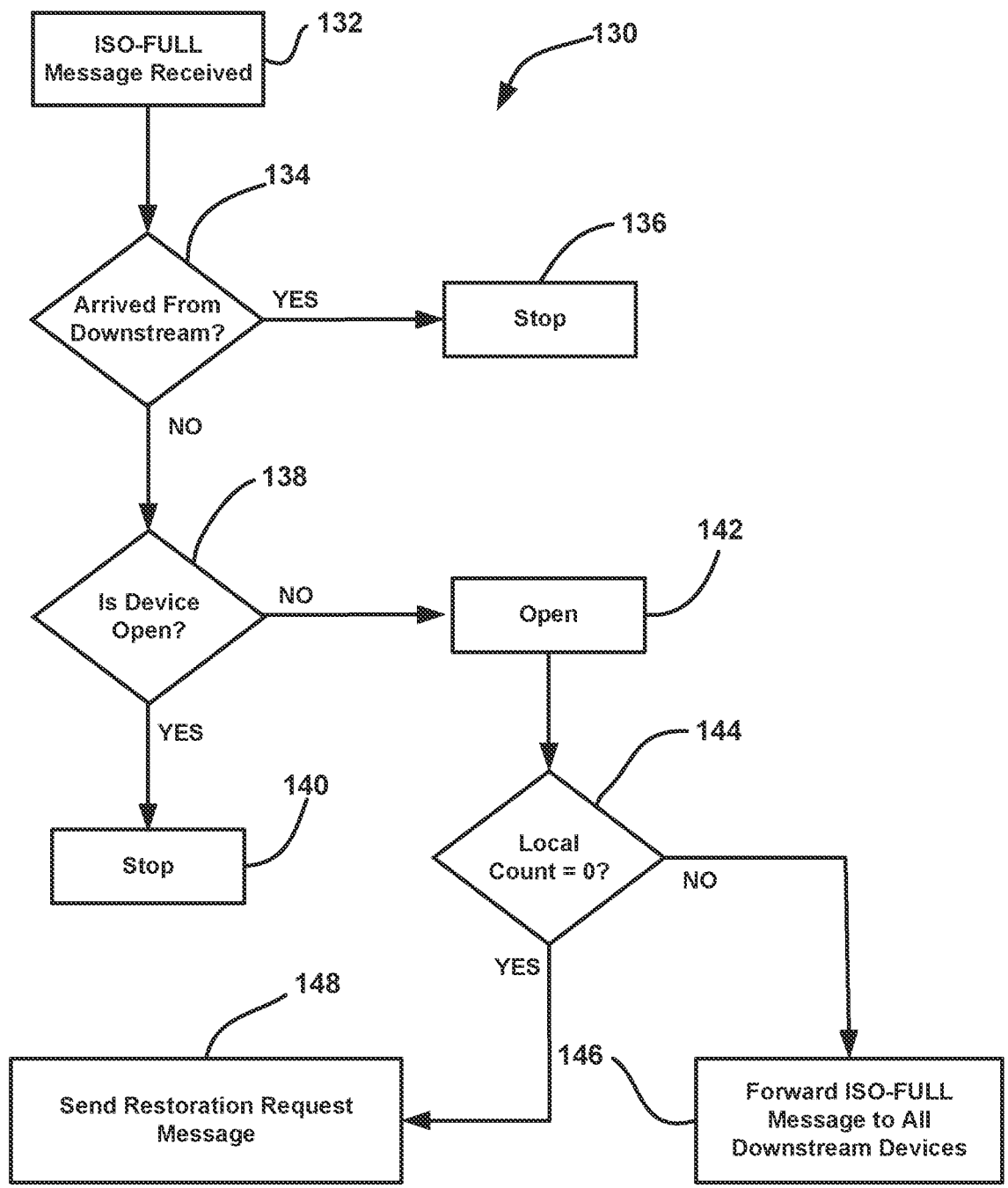
FIG. 6 is a flow chart diagram illustrating a process in the fault location and isolation scheme when a switching device receives an upstream open message.

FIG. 6 is a flow chart diagram 130 illustrating the process for when a device receives an ISO-FULL message at box 132. The algorithm determines if a message is received from a downstream device at decision diamond 134, and if so, the algorithm stops at box 136. If the message is not received from a downstream device at the decision diamond 134, then the algorithm determines if the device is open at decision diamond 138, and if so, the algorithm stops at box 140. If the device is not open at the decision diamond 138, the algorithm opens the device at box 142 and determines if the local count value is 0 at decision diamond 144. Otherwise, the algorithm forwards the ISO-OPEN message to all of the downstream devices at box 146. If the local count value is 0 at the decision diamond 144, then the algorithm sends a restoration request message at box 148.

Figure 7:
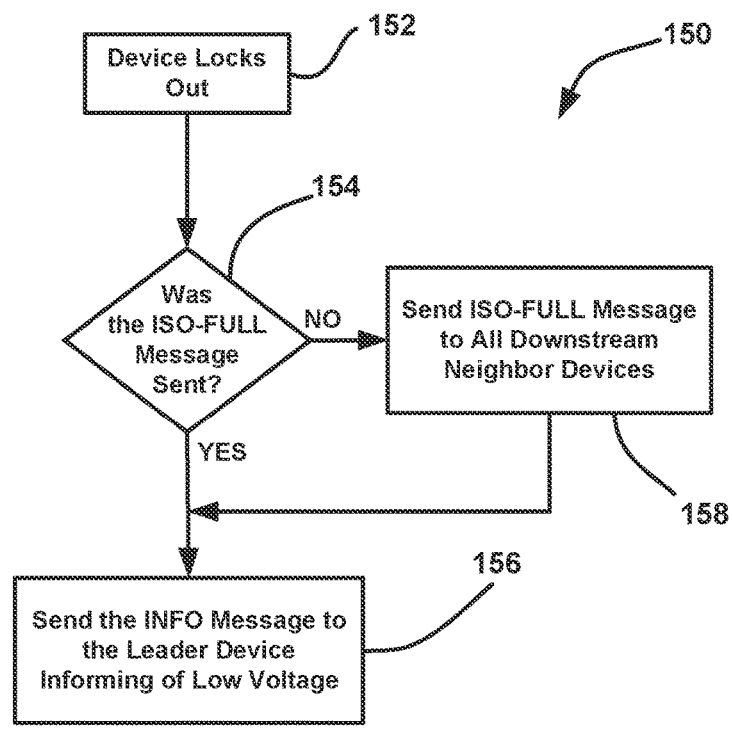
FIG. 7 is a flow chart diagram illustrating a process in the fault location and isolation scheme when a switching device locks out.

If a device encounters a lockout, it sends out an INFO message about the lock out. Additionally, if the device had not sent an ISO-FULL message in the past, it sends an ISO-FULL message to its downstream neighbor device(s) as well. FIG. 7 is a flow chart diagram 150 illustrating the process for when a device locks out at box 152. The algorithm determines whether the ISO-FULL message was sent at decision diamond 154, and if so, the algorithm sends the INFO message to the leader device informing of the low voltage at box 156. If the ISO-FULL message was not sent at the decision diamond 154, the algorithm sends the ISO-FULL message to all of the downstream neighbor devices at box 158 and then sends the INFO message to the leader device at the box 156.

The network 10, or a variation of the network 10, can be used to illustrate various scenarios of the fault location and isolation scheme as described above, where in these examples the ISO-DN count value is set to 2, the ISO-FULL count value is set to 3 and the lockout count value is set to 4 and the algorithms discussed herein are operating in all of the devices 24-36 simultaneously. In the first scenario, all of the devices 24-36 are fault-interrupting reclosing devices and the devices 24-36 are properly coordinated, i.e., no mis-coordination. If a permanent fault occurs in the section 42, the devices 28, 30 and 32 will detect the fault overcurrent. The device 28 will open in response to the fault current because of the proper device coordination, and the device 28 will increase its local count value to 1, fill in the first row of the values for its isolation table and start its C&I timer. The devices 28, 30 and 32 do not send C&I messages upstream because they do not have upstream LoV because the device 28 opens. The devices 30 and 32 do not increase their count value. The devices 26 and 34 do detect upstream LoV when the device 28 opens, but do not detect overcurrent because they are downstream of the fault, and therefore they do not send C&I messages to the upstream device 28, and current is not accumulated in the isolation table in the device 28. When the C&I timer expires in the device 28, the current matching test between the current downstream of the device 28 and the current measured by the device 28 is performed, but will fail because the devices 26 and 34 did not send C&I messages with current information. Therefore, the device 28 determines that the fault is in the section 42 immediately downstream of the device 28, and sends an INFO message according to the decision diamond 90 to inform the leader device in the network 10 that is responsible for restoration from alternate sources that a faulted section was found, and where it is. The INFO message is not a trigger to start restoration. Since this fault isolation scheme treats every overcurrent event separately, a check is put in place to avoid sending multiple INFO messages for the same section.

The device 28 then closes in the reclosing operation, detects fault current again, opens again, fills in another row of the isolation table, starts its C&I timer again and increases its count value to 2, where the count value of the devices 30 and 32 remains at 0, and where the device 28 reaffirms that the fault is in the section 42. Because its count value now matches the ISO-DN count value, the device 28 sends ISO-OPEN messages to the devices 26 and 34 to command them to open and isolate the fault at the downstream end of the section 42. Once they open, the devices 26 and 34 can send messages to their leader devices to request restoration. The device 28 recloses again and after opening again to interrupt the fault current, its count value increases to 3, which matches the ISO-FULL count value 3. However, since it is the device that is reclosing, no ISO-FULL message is sent and the device 28 will continue with its protection scheme. The next time the device 28 recloses it will open one more time due to OC, lock out due to its protection settings and isolate the upstream end of the section 42 so that power is restored to the sections 44 and 46. The local count for the device 28 also reaches 4 at this point.

Consider the scenario for the network 10 in FIG. 2, but where the devices 26, 28, 30 and 34 are sectionalizers and do not have the capability of breaking fault current or reclosing, and the devices 24, 32 and 36 are fault interrupting devices. If a permanent fault again occurs in the section 42, the device 32 will perform the reclosing operation, and when it opens, the devices 28, 30 and 32 will have detected fault current followed by upstream LoV and will increase their count value to 1, the devices 28, 30 and 32 will populate their fault isolation table, the devices 28 and 30 will send a C&I message upstream including their count value and their measured current, and the devices 28, 30 and 32 will start their C&I timer. The devices 30 and 32 receive C&I messages from their downstream neighbor devices and accumulate the current in their table, and when the C&I timers expire will perform the current matching test. Since the current matching test will pass in the devices 30 and 32, the algorithm will know that the fault is not in the sections 44 and 46. However, the current matching test will not pass in the device 28 and thus, as above, the algorithm will know that the fault is in the section 42.

The device 32 will then close and open again due to overcurrent since the fault is permanent. The devices 28, 30 and 32 will increase their count value to 2 when they again detect the fault current followed by upstream LoV, again populate their isolation table and again start their C&I timers, and the devices 28 and 30 will again send C&I messages upstream including their count value and their measured current. Since the count value in the device 28 is now 2, it will send the ISO-OPEN message downstream, the devices 26 and 34 will be opened, and the fault restoration process may close the device 24. The device 32 will then close again and the devices 28, 30 and 32 will increase their count value to 3 when they detect the fault current, again populate their fault isolation table and again start their C&I timers, and the devices 28 and 30 will again send C&I messages upstream including their count value and their measured current. Since the count value in the device 32 reaches 3, an ISO-FULL message is sent to the device 28 to open so that the fault is isolated in the section 42. The next time the device 32 recloses it will not detect fault current, and the devices 30 and 32 will remain closed.

Consider the scenario for the network 10 in FIG. 2, but where the devices 26, 30 and 34 are sectionalizers and do not have the capability of breaking fault current or reclosing, the devices 24, 28, 32 and 36 are fault interrupting devices and the devices 28 and 32 are mis-coordinated, where the device 32 has a faster protection setting. Thus, because of the mis-coordination, if the fault again occurs in the section 42, the device 32 will perform the reclosing operation, and when it opens, the devices 28, 30 and 32 will have detected fault current and will increase their count value to 1. The devices 28, 30 and 32 will populate their fault isolation table, the devices 28 and 30 will send a C&I message upstream including their count value and their measured current because they have detected fault current and then see LoV upstream, and the devices 28, 30 and 32 will start their C&I timer. The devices 30 and 32 will accumulate the current in their table, and when the C&I timers expire will perform the current matching test. Since the current matching test will pass in the devices 30 and 32, the algorithm determines that the fault is not in the sections 44 and 46. However, since C&I messages were not sent from the devices downstream of the device 28, the current matching test will not pass in the device 28 and thus, as above, the algorithm will know that the fault is in the section 42.

The device 32 will then close and the devices 28, 30 and 32 will increase their count value to 2 when they detect the fault current, again populate their fault isolation table and again start their C&I timers, and the devices 28 and 30 will again send C&I messages upstream including their count value and their measured current. The devices 30 and 32 will accumulate the current in their table, and when the C&I timers expire will perform the current matching test. Since the count value in the device 28 is now 2, it will send the ISO-OPEN message downstream, the devices 26 and 34 will be opened, and the fault restoration process may close the device 24. The device 32 will then close again and the devices 28, 30 and 32 will increase their count value to 3 when they detect the fault current, again populate their fault isolation table and again start their C&I timers, and the devices 28 and 30 will again send C&I messages upstream including their count value and their measured current. The devices 30 and 32 will accumulate the current in their table, and when the C&I timers expire will perform the current matching test. Since the count value in the device 28 is now at 3, which matches the ISO-FULL count value it will lock open and the fault will be isolated in the section 42. The next time the device 32 closes to test the fault the last time, it will not detect fault current because the device 28 is open, and will remain closed.

Figure 8:
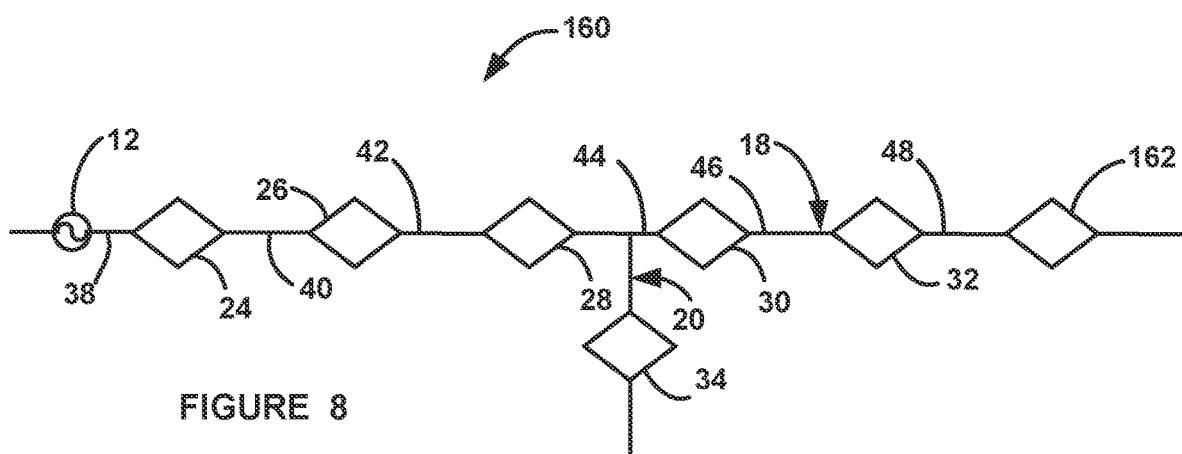
FIG. 8 is a simplified schematic type diagram of an electrical power distribution network for illustrating a fault location and isolation scheme when two permanent faults occur sequentially on different phases.

A scenario may occur where two permanent faults occur sequentially, one after another and are on different phases. FIG. 8 is a simplified schematic type diagram of an electrical power distribution network 160 that is similar to the network 10 illustrating this scenario, where like elements are identified by the same reference number, and where the source 12 provides the power to the network 160 and a switching device 162 is added to the feeder 18. For this example scenario, the devices 24, 34 and 162 are reclosing devices and the devices 26, 28, 30 and 32 are sectionalizers. The first fault occurs in the section 42, and the device 24 opens in a reclosing operation. The device 26 sends a C&I message and increases its local count value to 1, and the device 24 also increases its count value to 1, but does not send a C&I message. The device 24 receives a C&I message from the device 26, performs the current matching test, and concludes that the section 40 is not faulted. The device 26 does not receive a C&I message from the device 28, performs the current matching test when its C&I timer expires, which results in NOT PASS, and determines that the section 42 is faulted. The device 24 then recloses to test for the fault in the section 42, but a second fault in the section 46 occurred while the device 24 was open. After closing of the device 24, the devices 24, 26, 28 and 30 detect fault current, and the device 24 opens again to interrupt it. This time the devices 26, 28 and 30 detect LoV and increase their local count values by 1, and all send C&I messages to their upstream neighbor device. The device 24 also increases its count value to 2, but does not send a C&I message. The devices 24 and 26 now have a count value of 2 and the devices 28 and 30 have a count value of 1.

The devices 24, 26, 28 and 30 then perform the current matching test, which results in a PASS for the devices 24 and 28 and a NOT PASS for the devices 26 and 30. The current matching test is performed per phase, and although the devices 26 and 30 receive C&I messages from their downstream neighbor devices, the test results in NOT PASS in those devices because the currents do not match for the faulted phases. Thus, the sections 42 and 46 are identified and labeled as faulted. Since the faults are permanent, from this point on the count values in the devices 24 and 26 are always one count value ahead of the count values in the devices 28 and 30. Thus, assuming that all of the devices 24, 26, 28 and 30 have the same ISO-DN and ISO-FULL count values, the device 26 is the first device on a faulted section to reach either count value, and it first sends an ISO-OPEN message. Referring to the decision diamond 118, the devices 28 and 30 do not open when they receive ISO-OPEN messages because their counts are higher than 0, and forward those messages further downstream, which ultimately results in the devices 34 and 32 opening and initiating restoration. When the device 26 reaches its ISO-FULL count value it opens and sends the ISO-FULL message. According to the logic described above for the flow diagram 130, this results in the devices 28 and 30 opening. However, only the sections 42 and 46 are marked as faulted. If there is an alternative source beyond the device 34 with sufficient capacity, the section 44 will subsequently connect to and be powered by it. The device 26 will test for the fault one more time and will subsequently open and lock out because the fault is permanent.

Figure 9:
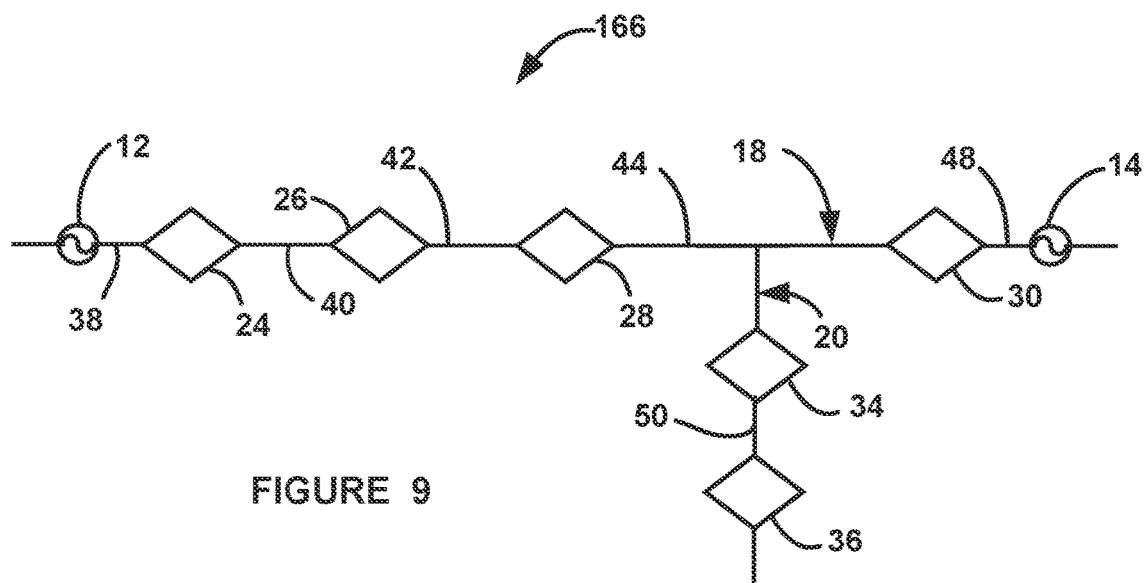
FIG. 9 is a simplified schematic type diagram of an electrical power distribution network for illustrating a fault location and isolation scheme when two permanent faults occur simultaneously on different phases.

A scenario may occur where two permanent faults occur simultaneously on different phases. FIG. 9 is a simplified schematic type diagram of an electrical power distribution network 166 illustrating this scenario that is similar to the network 10, where like elements are identified by the same reference number, and where the device 32 has been removed and the feeder 20 is coupled to the section 44. For this example scenario, the devices 24, 30 and 36 are reclosing devices and the devices 26, 28 and 34 are sectionalizers, and the faults occur simultaneously in the sections 42 and 50. When the faults occur, the devices 28, 30 and 34 detect the fault, and the device 30 opens, increases its count value to 1, starts its C&I timer and populates its fault isolation table. The devices 28 and 34 then detect LoV upstream and increase their count value to 1 and send a C&I message upstream. When the C&I timers expire in the devices 28, 30 and 34, the devices 28 and 34 have not received C&I messages from downstream, but the device 30 has received two C&I messages from downstream, and therefore, both of the fault currents will be accumulated in the isolation table of the device 30 and be compared to the current measurement that the device 30 makes in the current matching test. Since the currents will match, the section 44 is not labeled as faulted. However, since the devices 28 and 34 did not receive C&I messages when their timers expired, then the sections 42 and 50 are labeled as faulted. The device 30 closes and opens again for reclosing purposes, and the same measurements are made, the same C&I messages are transmitted, and the count values of the devices 28, 30 and 34 are increased to 2. Because the count value in the devices 28 and 34 match the ISO-DN count value and they have not received downstream C&I messages, the devices 28 and 34 will send an ISO-DN message to the devices 26 and 36, respectively, instructing them to open and isolate the downstream end of the sections 42 and 50. The device 24 can also be closed to restore power to the section 40. The device 30 recloses again, the same currents are measured, the same C&I messages are transmitted and the count values are increased by 1 in the devices 28, 30 and 34. The count value in the devices 28 and 34 matches the ISO-FULL count, so they open to lock out and isolate the upstream end of the sections 42 and 50. The next time the device 30 closes, the fault current is not present and it will remain closed restoring power to the section 44.

Figure 10:
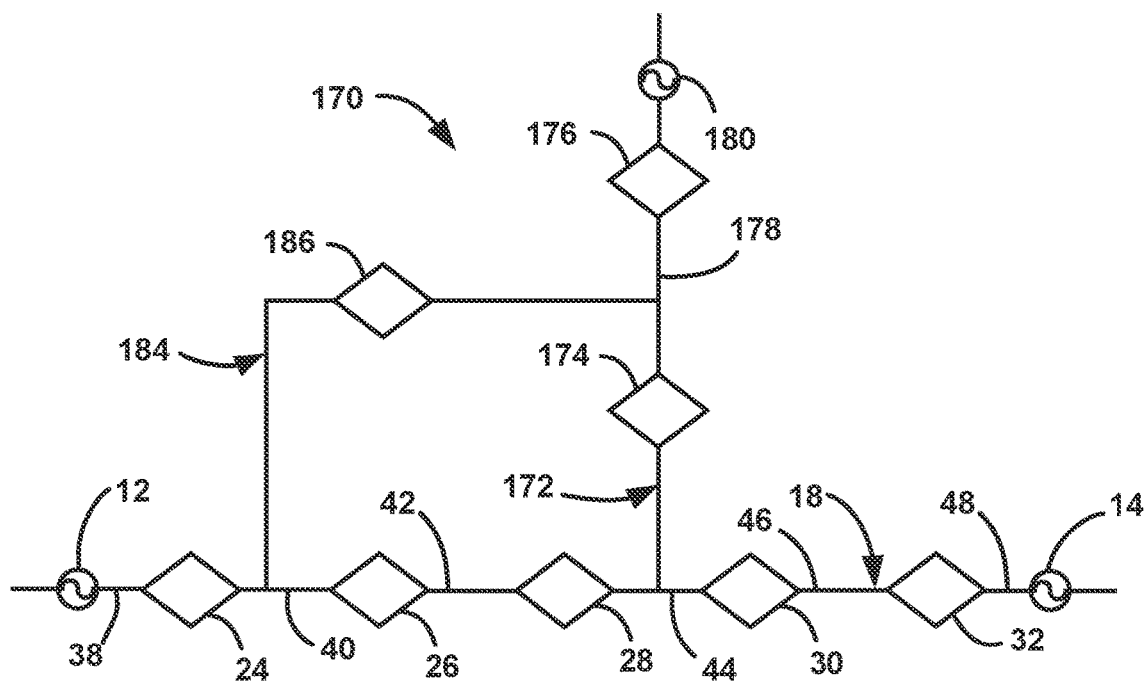
FIG. 10 is a simplified schematic type diagram of a closed-loop electrical power distribution network for illustrating a fault location and isolation scheme.

FIG. 10 is a simplified schematic type diagram of a closed-loop electrical power distribution network 170 that can be used to illustrate a simple example of the fault location and isolation scheme discussed above for a closed-loop network, where like elements to the network 10 are identified by the same reference number, and where all of the devices are fault interrupters and have the same ISO-FULL, ISO-DN and lockout count values. In the network 170, a secondary feeder 172 is coupled to the primary feeder 18 at the section 44 and includes switching devices 174 and 176 defining a section 178, where an AC source 180 is connected to the device 176 opposite to the device 174. Another secondary feeder 184 is coupled to the section primary feeder 18 at the section 40 and the secondary feeder 172 at the section 178, and includes a normally open switching device 186.

If a fault occurs in the section 44, all of the devices 28, 30 and 174 have to open to stop the fault current, and when they do open, their local count values will be increased to 1, they will record a row entry in their fault isolation tables and will start their C&I timers. The devices do not send C&I messages because they do not detect LoV upstream. Without any loss of generality, it is assumed that in this case the ISO-DN count value is set to 1. The devices 28, 30 and 174 perform current matching tests when their C&I timers expire, which all result in NOT PASS, and thus attempt to open downstream devices for isolation using ISO-OPEN messages, where the device 28 attempts to open the devices 30 and 174, the device 30 attempts to open the devices 28 and 174, and the device 174 attempts to open the devices 28 and 30. However, the ISO-OPEN messages do not arrive at the devices 28, 30 and 174 from the upstream direction, but from the downstream direction. In other words, if messages are received by a device from a downstream device, then the message is ignored. This reclosing and message sending of the devices 28, 30 and 174 will continue until their count value reaches 4, where all three of the devices 28, 30 and 174 will lockout and isolate the fault in the section 44. In general, regardless of the user settings for ISO-DN and ISO-FULL count values, the scheme behaves properly, and is capable of immediate isolation, or waiting until lockout.

The network 10 can also be used to illustrate the desired operation when galloping faults occur, where all of the devices 24-36 are fault interrupting devices. In this scenario, the network 10 has one permanent phase-to-phase fault that generates a fault upstream when it is interrupted. The second fault occurs as a result of conductor slap, and occurs more than two cycles after the initial fault is interrupted. It is assumed that the network 10 is properly coordinated, where for any current value in the network 10, the protection settings for the device 28 are faster than the devices 30 and 32, and the protection settings for the device 30 is faster than the device 32. Without loss of generality, it is assumed that the ISO-DN count value is set to 1 in all of the devices 24-36 and the ISO-FULL count value is set to 3 in all of the devices 24-36. All of the devices 24-36 are configured to lockout on the 4th opening (shot) during reclosing. Furthermore, it is assumed that the conductor slap fault occurs during the first open interval in the reclosing sequence for the device 28.

If a fault occurs in the section 42, each of the devices 28, 30 and 32 measure overcurrent. The faster device 28 opens and each of the devices 28, 30 and 32 measures a healthy voltage upstream. The device 28 stores the over-current information, increases its local count value by 1 and starts its C&I timer, where the devices 30 and 32 do not increase their counts. When the C&I timer expires in the device 28, the current matching test fails because the fault is in the section 42 and no current information was received from downstream. The ISO-DN count value is reached and the device 28 sends the ISO-OPEN message to the devices 26 and 34 and they open. The device 28 also sends an INFO message indicating that the fault is in the section 42. The device 28 then recloses and at the same time a conductive slap fault appears in the section 44, and the devices 30 and 32 will measure overcurrent. The device 30 opens and measures a healthy voltage upstream, and creates a table entry to store the overcurrent information because it detected overcurrent and has opened to clear the fault. The device 32 also measures a healthy upstream voltage. The device 30 increases it local count value by 1 and starts its C&I timer, and when the C&I timer expires, its current matching test fails because the device 28 does not send the C&I message as it had not detected overcurrent. The ISO-DN value is reached in the device 30 and it sends an ISO-OPEN message to the device 28. The device 28 performs the logic of the flow diagram 110 and sends an INFO message indicating that the section 44 is faulted. Since the device 28 has a count value that is not 0 it forwards the ISO-OPEN message to the devices 26 and 34. Both of the devices 26 and 34 also perform the logic of the flow diagram 110, and both open as a result.

The device 30 will reclose and then the device 28 will reclose as well, since the conductor slap fault is gone at this time and the device 28 detects healthy voltage. The fault in the section 42 will reappear, and the steps discussed above will repeat. Eventually the device 28 will reach the ISO-FULL count value and the logic in the flow diagram 80 will be performed. Since the device 28 had loss of voltage in the past, it locks out. The conductor slap fault reappears in the section 44 and the devices 30 and 32 measure overcurrent.

The device 30 opens and measures a healthy voltage upstream, and creates a table entry to store the overcurrent information. The device 32 also measures a healthy upstream voltage. The device 30 increases its local count value by 1 and starts its C&I timer, and when the C&I timer expires, its current matching test fails, the ISO-FULL count value is reached and it sends an ISO-FULL message to the device 28, which forwards it to the devices 26 and 34 that perform the logic of the flow diagram 130. The device 30 then recloses. The device 28 does not close again because it was locked out in the previous step. The conductor slap fault does not return because it was isolated downstream of the device 28, and a new stable state is reached. It is assumed that restoration efforts on the other side of the device 24 and the device 34 took place.

During the fault restoration process, many messages are transmitted between the switching devices for coordination and otherwise. During the reclosing event, each reclosing shot typically increases in duration, where the first reclosing shot may be very quick and may not provide enough time for the required messaging between the devices, where some of the devices may not know that the first or first couple of reclosing operations have been performed.

The fault location and isolation scheme discussed above is based on local measurements and messaging among participating devices and requires that each participating device be capable of communicating with the other devices and also be able to measure current and voltage. However, because measuring voltage requires a reference potential, some less expensive or less sophisticated sectionalizers and other types of switching devices may not include voltage sensors and can only measure current. In the cases where the particular device is not able to measure voltage, the fault location and isolation schemes discussed above can be augmented using a revised fault location and isolation scheme proposed below, so that the isolation algorithm still provides important benefits, including supporting unlimited segmentation with either sectionalizers or reclosers, work with closed-loop configurations, work with communication interruptions, work with mis-coordinated configurations and prevent the wrong device from lockout, reduce network traffic, and work with multiple faults, both synchronous and sequential. However, due to the lack of voltage sensors, the network experiences increased volume of messages sent between the devices. In addition, certain mis-coordinated configurations may not be handled as well as in the scheme requiring voltage sensors.

As mentioned, the revised fault location and isolation scheme modifies the process described above for fault location and isolation by extending the capability of the scheme to work even if the participating switching devices lack voltage measurements. Three modifications are presented, each with its benefits and shortcomings. It is up to the user to select which one to use, based on the properties of the network. However, this needs to be a system-wide selection, where the same modification has to be applied on all of the devices in the system regardless of whether they have voltage sensors or not. It is emphasized that the isolation logic is a supplemental engine to protection, and that all fault interruptions are performed by protection. It is noted that a switching device will know if its upstream device has a voltage sensor and if a switching device does not itself have a voltage sensor it will assume that the upstream device also does not have a voltage sensor, and if a device does not have a voltage sensor it will always send a C&I message.

As discussed above, there are four key decisions made by the fault location and isolation scheme, namely, whether to make a table entry in the fault isolation table of a device and increase the local count value when fault current is interrupted, whether to send a C&I message to an upstream device, whether to send an ISO-OPEN message to a downstream device when the local count value reaches the ISO-DN value, and whether to lock out and send the ISO-FULL message when the local count value of a device reaches the ISO-FULL value. From these four key decisions, the decision of whether to send an ISO-OPEN message to a downstream device when the local count value reaches the ISO-DN value does not depend on the ability to measure LoV. Therefore, only the other decisions are modified to accommodate for the lack of a voltage sensor in a device.

The discussion below summarizes three modifications to the algorithms discussed above for fault location and isolation to accommodate four operational scenarios including the first algorithm used in the original fault location and isolation scheme in which all of the devices have functional voltage sensors, which is repeated here for reference only, where this algorithm is referred to below as "original logic." A second algorithm is employed for the scenario where some of the devices lack the capability to measure voltage, where this modified logic is appropriate for topologies where the probability of mis-coordination is higher than that of message loss, and this algorithm is referred to below as "modified logic A." A third algorithm is employed for the scenario where some devices lack the capability to measure voltage, where this modified logic is appropriate for topologies where the probability of message loss is higher than that of mis-coordination, and this algorithm is referred to below as "modified logic B." A fourth algorithm is employed for the scenario where some of the devices lack the capability to measure voltage, but LoV is inferred using current measurements, where this algorithm is referred to below as "inference logic".

Although some of the devices in the network may not have a voltage sensor, upstream LoV can be inferred by measuring current. If an upstream device opens to clear a fault, the downstream device experiences a drop in current as well as the upstream LoV. Therefore, a threshold for current can be used to infer whether an upstream LoV occurred or not. If before the fault the current was above the threshold, and after the fault the current dropped below the threshold and the device did not open, it can be inferred that LoV occurred. If both before and after the fault the current was above the threshold, it can be inferred that LoV did not occur. If before the fault the current was below the threshold, whether a LoV occurred cannot be inferred. Note that this inference of LoV using current measurement is performed only if the device experienced an overcurrent event that was interrupted. An underlying assumption for the inference logic is that if a device measures current above a certain threshold, the device upstream of it also measures current above that same threshold, where the threshold level should be set at the tolerance of the current sensor.

When a fault occurs, it is the overcurrent protection mechanism of a device that eventually trips the device to interrupt the fault. After an overcurrent event is interrupted by protection, logical fault location is triggered, and the device creates an entry in its fault isolation table and increases its local count value if any of the following conditions occur. For the original logic, the device opens to interrupt or the device detects upstream LoV. For the modified logic A and B, the device opens to interrupt, the device has a voltage sensor and it detects upstream LoV or the device does not have a voltage sensor. For the inference logic, the device opens to interrupt, the device has a voltage sensor and it detects upstream LoV, the device does not have a voltage sensor, the current before the overcurrent event was above the threshold and the current following the event dropped below the threshold, or the device does not have a voltage sensor and the current before the overcurrent event was below the threshold.

As described above for the original fault location and isolation scheme, once an overcurrent event is interrupted, if an upstream LoV is detected, or the device itself opened to interrupt the fault, a fault immediately downstream of the device is suspected. The device then makes an entry in its fault isolation table and increases its local count value. The device later uses this table entry, and C&I messages from downstream devices, to determine if the fault is immediately downstream of itself. The original fault location and isolation scheme contains detailed logic regarding C&I messages, and simplified logic is provided here for reference. If a device receives a C&I message from a downstream device within the C&I timeout period, after experiencing an overcurrent event, it determines that the fault is not in the immediate downstream section. If a device reaches the C&I timeout without having received a C&I message, it determines that the section immediately downstream of it is faulted. If the message is not received within the timeout, a device has no way of detecting whether a C&I message was actually sent but was lost in the communications channel. Thus, if a C&I message is lost, it means that the upstream device made an error by labeling the section immediately downstream as faulted, although it really is not. If the device does not have a voltage sensor it cannot determine if upstream LoV occurred, but assumes that it did. It thus increases its local count and generates a table entry. Assuming good communications between the devices, the logic discussed below guarantees that the upstream device receives C&I messages from its downstream neighbor devices to make the correct determination of the fault location.

A device sends a C&I message after an overcurrent event is interrupted if any of the following conditions occur. For the original logic, the device detects upstream LoV. For the modified logic A and B, the device has a voltage sensor and it detects upstream LoV, the device immediately upstream does not have a voltage sensor or the device does not have a voltage sensor. For the inference logic, the device has a voltage sensor and it detects upstream LoV, the device does not have a voltage sensor, the current before the overcurrent event was above the threshold and the current following the event dropped below the threshold, the device does not have a voltage sensor and the current before the overcurrent event was below the threshold or the device immediately upstream does not have a voltage sensor and the current after the overcurrent event was below the threshold.

A return of healthy voltage for a device that did not open, after an overcurrent event is interrupted, indicates that the fault is further downstream of that device as opposed to being immediately downstream of it. For a device that could not detect the return of healthy voltage it needs a C&I message from its downstream devices to determine whether the fault is immediately or further downstream of itself. This message is needed regardless of whether the device itself opened or not, because the opening could be a result of mis-coordination.

When a device that detects a return of healthy voltage and knows that its upstream device has a voltage sensor, it can deduce that the upstream device can also detect the return of healthy voltage. In this case the upstream device can determine that the fault is further downstream based only on local measurements, and therefore the downstream device does not need to send it a C&I message.

In all other cases, covered by the conditions discussed above, the downstream device needs to send a C&I message so that the upstream device can determine the fault location. Note that the implication of this modification is that more C&I messages need to be sent as compared to the original scheme in order to retain proper functionality.

When a device reaches its ISO-DN count value and it determines that the fault is immediately downstream of itself, it sends an ISO-OPEN message to its downstream devices in order to isolate on the downstream side of the fault. The logic presented above maintains the ability of the device to determine the location of the fault regardless of having the voltage sensor or not, and therefore no further modifications are needed to isolate the downstream side of the fault.

When a device reaches the ISO-FULL count value, which is normally set lower than any upstream device lockout count value, and detects an upstream LoV, it needs to open and lock out before a further upstream device locks out. To accommodate a lack of voltage sensor, this logic needs to be modified as follows. A device locks out when its local count value reaches the ISO-FULL count value and it has determined that the fault is immediately downstream of itself based on the isolation table and C&I messages, if any of the following conditions occur. For the original logic, the device detects upstream loss of voltage. For the modified logic A, the device has a voltage sensor and it detects upstream LoV or the device does not have a voltage sensor and it did not open to interrupt the fault current. For the modified logic B, the device has a voltage sensor and it detects upstream LoV or the device is a sectionalizer and it does not have a voltage sensor. For the inference logic, the device has a voltage sensor and it detects upstream LoV, the device is a sectionalizer and does not have a voltage sensor or the device is a recloser, does not have a voltage sensor, the current before the fault was above the threshold, the current after the fault was below the threshold and the device did not open to interrupt the fault.

The original fault location and isolation scheme in which all of the devices have a voltage sensor could handle both mis-coordination and C&I message loss. Without voltage sensors only one of these contingencies can be handled, but not both. The modified logic A is able to handle mis-coordination, whereas the modified logic B is able to handle C&I message loss. One or the other should be used based on the likelihood of each contingency. Note that sectionalizers by their nature are always mis-coordinated with the recloser upstream of them and therefore handling mis-coordination is always prioritized for sectionalizers, and there is no difference in their behavior between modified logic A and B.

This tradeoff for reclosers is explained using the following two scenarios. One scenario is when two reclosers without voltage sensors are mis-coordinated and there is no C&I message loss. In this case the upstream device performs the reclosing sequence, and both of the devices reach the ISO-FULL count value together. Assuming that the ISO-FULL count is lower than the lockout count, the modified logic A makes sure that the downstream recloser now locks out despite not sensing LoV, so that the section upstream of it remains powered when the upstream recloser recloses the last time. With the modified logic B, however, the downstream recloser would not lock out resulting in the upstream recloser locking out.

The second scenario is when the network is coordinated, but a C&I message is lost. If the intended recipient of this message does not have a voltage sensor, it determines that the fault is immediately downstream. According to the original logic, when a device determines that the downstream section is faulted and the device itself did not open and did not detect return of healthy voltage, it suspects mis-coordination. It then locks out upon reaching its ISO-FULL count value, before a further upstream device locks out, so that the fault is isolated properly. This behavior is maintained under the modified logic A for devices without voltage sensors. However, in the scenario described here, the network is actually coordinated, but because the C&I message was lost, it appears as mis-coordinated. Applying the original logic or the modified Logic A in this case would leave unfaulted sections de-energized after isolation. The modified logic B prevents premature lockout on an ISO-FULL count value in this scenario, and allows the downstream device to lock out and isolate properly. Note that if both the recloser upstream of the fault and another recloser further upstream interrupt the fault simultaneously, an unfaulted section between the two devices is eventually left unpowered. Neither the modified Logic A nor B can make the network isolate properly in this scenario if the network 10 experiences both mis-coordination and a C&I message loss when the devices don't have voltage sensors.

If LoV inference is used the original level of performance is maintained as long as the current threshold is set at the level of tolerance/noise for the current sensor, and the current to supply the load in every section bounded by two or more protective devices is above that threshold. If the load in a section is too low and a C&I message is lost, then that section may be left unenergized even if it is unfaulted.

The original fault location and isolation scheme describes fault isolation as a function of logical steps and proper configuration of internal settings. Among the settings are ISO-DN and ISO-FULL count values, where ISO-DN is a local count value to indicate when the device should isolate downstream of the fault and ISO-FULL is a local count value to indicate when the device should isolate upstream of the fault. When the ISO-DN count value is reached the device makes a decision on whether to send ISO-OPEN messages to open its downstream neighbor devices. The setting holds equally for both sectionalizers and reclosers. When the ISO-FULL count value is reached the device makes a decision on whether to lock out and send ISO-FULL messages to its downstream neighbor devices. The setting holds equally for both sectionalizers and reclosers, however, reclosers only use this setting if they detect or suspect mis-coordination. The original fault location and isolation scheme also shows that there are more settings that need to be configured for isolation to work properly, but all others are not relevant to the case of lack of voltage sensing.

The network 10 can be used again to provide a simple illustration of the revised fault location and isolation scheme as discussed above, where there is coordination between the devices. In this example, the devices 24, 28 and 32 are mis-coordinated fault interrupting recloser devices and the devices 26, 30 and 34 are sectionalizers that do not have a voltage sensing or reclosing capability. If the fault occurs in the section 42, the device 32 will perform the reclosing operation, and when it opens, the devices 28, 30 and 32 will have detected fault current and will increase their count value to 1, populate their fault isolation table, and will start their C&I timer. The devices 28 and 30 will send a C&I message upstream including their count value and their measured current because the device 28 will have detected fault current and then LoV upstream, but the device 30 can't measure voltage and sends its message anyway because it knows this. The devices 30 and 32 will accumulate the current in their fault isolation table, and when the C&I timers expire will perform the current matching test. Since the current matching test will pass in the devices 30 and 32, the algorithm will determine that the fault is not in the sections 44 and 46. However, the current matching test will not pass in the device 28 and thus, as above, the algorithm will determine that the fault is in the section 42. When the device 32 recloses again, the same operation occurs and the count values of the device 28 and 30 increase to 2, which matches the ISO-DN value. Since the section 42 was labeled as faulted previously, it is the device 28 that sends the ISO-OPEN messages to the devices 26 and 34, according to the logic of the flow diagram 80. The device 32 recloses again and its count value increases to 3, which matches the ISO-FULL count value 3. However, since it is the device that is reclosing, no ISO-FULL message is sent and the device 28 will continue with its protection scheme. The next time the device 28 recloses it will increase its count value to 4 and it will lockout and isolate the upstream end of the section 42 so that power is restored to the sections 44 and 46.

The network 10 can also be used to provide a simple illustration of the revised fault location and isolation scheme as discussed above, where there is coordination between the devices, and the inference logic is employed. Also, in this example, the devices 24, 28 and 32 are fault interrupting recloser devices and the devices 26, 30 and 34 are sectionalizers that do not have a voltage sensing or reclosing capability and are using inference. If the fault occurs in the section 42, the device 28 will perform the reclosing operation, and when it opens, the devices 28, 30 and 32 will have detected fault current and will increase their count value to 1. Only the device 28 populates its isolation table and sends the C&I message. The device 30 infers healthy voltage by the fact that its current does not drop below the low current threshold. However, the message sent from the device 28 to the device 30 is compromised and is not received. Thus, although the device 30 never received the C&I message, through inference, it is able to properly determine that the section 44 is not faulted.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for locating and isolating a fault in a power distribution network, the network including at least one power source, at least one feeder and a plurality of switching devices positioned along the at least one feeder and being in communications with each other, where network sections are defined between adjacent switching devices and where all of the switching devices have overcurrent sensing capability and at least one of the switching devices does not have a voltage sensing capability, the method comprising:

detecting an overcurrent event in the network from the fault by at least some of the switching devices;

interrupting the overcurrent event by opening and then immediately locking out or performing subsequent reclosing operations by a switching device of the at least some of the switching devices that detected the overcurrent event;

increasing a count value in the switching device of the at least some of the switching devices that detected and interrupted the overcurrent event, in each of the switching devices that detected the overcurrent event and then detected loss of voltage upstream, in each of the switching devices that detected the overcurrent event and does not have a voltage sensing capability, and in each of the switching devices that detected the overcurrent event but does not have a voltage sensing capability and inferred a loss of voltage upstream by measured current;

sending a count and current (C&I) message from the each of the switching devices that detected the overcurrent event and then detected the loss of upstream voltage, from the each of the switching devices that detected the overcurrent event and has an upstream neighbor switching device that does not have a voltage sensing capability, from the each of the switching devices that detected the overcurrent event and does not have a voltage detecting capability, and from the each of the switching devices that detected the overcurrent event but does not have a voltage detecting capability and inferred loss of voltage upstream by measured current, the C&I message including a current locally measured by the sending switching devices and a count value of the sending switching devices;

starting a C&I timer in the each of the switching devices that sent a C&I message;

performing a current matching test, in each of the switching devices in which the C&I timer has expired, between the measured current received in a C&I message by that switching device and a current measured by that switching device;

populating a fault isolation table in the each switching device that detects the overcurrent event that includes its count value, its measured current and accumulated current from a received C&I message;

repeating interrupting the overcurrent event, increasing the count value, sending the C&I messages, starting the C&I timer, performing the current matching test and populating the fault isolation table;

determining that the fault is in an immediate downstream section of one of the switching devices based on the count value in the one of the switching devices matching a predetermined first count value and a current matching test failure; and sending a downstream switch open message to an immediate downstream switching device from the one of the switching devices that determined that the fault is in the immediate downstream section to isolate a downstream end of the immediate downstream section.

2. The method according to claim 1 further comprising sending an upstream switch open message to a downstream switching device to open the switching device from a sending switching device that has a count value matching a predetermined second count value and if the sending switching device has a voltage sensing capability and detects an upstream loss of voltage, the sending switching device does not have a voltage sensing capability and did not open to interrupt the overcurrent event, the switching device is a sectionalizer, and if the sending switching device is capable of interrupting the overcurrent event, does not have a voltage sensing capability and inferred the loss of voltage from measured current, wherein the first count value is less than the second count value.

3. The method according to claim 2 further comprising locking open the switching device that detected the over current event when the count value in the switching device matches a predetermined third count value, wherein the third count value is greater than the second count value, and wherein the switching device ignores the upstream switch open message if it receives it, and opens if the count matches and if there is upstream loss-of-voltage (LoV).

4. The method according to claim 1 further comprising sending an information message containing fault location information from the switching device that determined that the fault is in its-the immediate downstream section.

5. The method according to claim 4 further comprising sending a power restoration request message following isolation of a faulted section using the fault location information from the information message.

6. The method according to claim 1 wherein inferring the loss of voltage by the switching devices that do not have a voltage sensing capability includes determining that a current was below a current threshold before the overcurrent event.

7. The method according to claim 1 wherein inferring the loss of voltage by the switching devices that do not have a voltage sensing capability includes comparing a measured current before the overcurrent event and after the overcurrent event.

8. The method according to claim 7 wherein inferring the loss of voltage by the switching devices that do not have a voltage sensing capability includes determining that the measured current before the overcurrent event was above a current threshold, then determining that the measured current dropped below the current threshold after the overcurrent event.

9. The method according to claim 1 wherein one of the switching devices detects a return to a healthy voltage and knows that its upstream neighbor device has a voltage sensor deduces that an upstream switching device also detects the return to healthy voltage.

10. The method according to claim 1 wherein performing a current matching test includes computing a difference between the measured current by one of the switching devices and accumulated current from C&I messages received by the one switching device.

11. The method according to claim 1 wherein each device has a loss-of-voltage (LoV) Boolean indicator, which is stored separately from the fault isolation table, which holds the state of whether the switching device detected upstream LoV after the overcurrent event was interrupted.

12. The method according to claim 1 wherein the switching devices are coordinated where the switching device that interrupts the overcurrent event is a switching device located closest upstream of the fault having fault interrupting capabilities.

13. The method according to claim 1 wherein the switching devices are mis-coordinated where the switching device that interrupts the overcurrent event is switching device not located closest upstream of the fault having fault interrupting capabilities.

14. The method according to claim 1 wherein the method locates and isolates multiple sequential faults, multiple simultaneous faults and galloping faults.

15. The method according to claim 1 wherein the network is designed to support unlimited segmentation with sectionalizers or reclosers.

16. The method according to claim 1 wherein the network is a closed-loop network.

17. The method according to claim 1 wherein some of the switching devices have fault interrupting capabilities and some of the switching devices do not have fault interrupting capabilities.

18. The method according to claim 1 wherein the switching devices are reclosers, sectionalizers or circuit breakers.

19. A method for locating and isolating a fault in a power distribution network, the network including at least one power source, at least one feeder and a plurality of switching devices positioned along the at least one feeder and being in communications with each other, where network sections are defined between adjacent switching devices and where all of the switching devices have overcurrent sensing capability and where at least one of the switching devices does not have a voltage sensing capability, the method comprising:

increasing a count value in a switching device that interrupted an overcurrent event and in each of the switching devices that detected the overcurrent event;

sending a count and current (C&I) message from each of the switching devices that detected the overcurrent event and then measured a loss of voltage upstream, from the each of the switching devices that detected the overcurrent event and has an upstream neighbor switching device that does not have a voltage sensing capability, from the each of the switching devices that detected the overcurrent event and does not have a voltage detecting capability, and from the each of the switching devices that detected the overcurrent event but does not have a voltage detecting capability and inferred loss of voltage upstream by measured current, the C&I message including a current measured by the each of the sending switching devices sending a count and current (C&I) message and a count value of the each of the sending switching devices sending a count and current (C&I) message;

starting a C&I timer in the each of the switching devices that sent a C&I message;

performing a current matching test in the each of the switching devices that started the C&I timer and the C&I time has expired, between the measured current that may have been received in a C&I message by that switching device and current measured by that switching device;

repeating increasing the count value, sending the C&I messages, starting the C&I timer and performing the current matching test in response to repeated interruptions of the overcurrent event;

determining that the fault is in an immediate downstream section of one of the switching devices based on the count value in the one of the switching devices matching a predetermined first count value and a current matching test failure; and sending a downstream switch open message to an immediate downstream switching device from the one of the switching devices that determined that the fault is in the immediate downstream section to isolate a downstream end of the immediate downstream section.

20. The method according to claim 19 further comprising sending an upstream switch open message to a downstream switching device to open the switching device from a sending switching device that has a count value matching a predetermined second count value if the sending switching device has a voltage sensing capability and detects an upstream loss of voltage, the sending switching device does not have a voltage sensing capability, and did not open to interrupt the overcurrent event, the switching device is a sectionalizer and does not have a voltage sensing capability and the sending switching device is capable of interrupting the overcurrent event, does not have a voltage sensing capability and inferred the loss of voltage from measured current, wherein the first count value is less than the second count value.

21. The method according to claim 20 further comprising locking open the switching device that detected the over current event when its count value matches a predetermined third count value and that detected upstream loss-of-voltage (LoV), wherein the third count value is greater than the second count value, wherein the switching device that detected the over current event ignores the upstream switch open message if it receives it.

22. The method according to claim 19 further comprising sending an information message containing fault location information from the switching device that determined that the fault is in the immediate downstream section.

23. The method according to claim 19 wherein inferring the loss of voltage by the switching devices that do not have a voltage sensing capability includes determining that the measured current before the overcurrent event was above a current threshold, then determining that the measured current dropped below the current threshold after the overcurrent event.

* * * * *